United States Patent [19]
Holcomb et al.

[11] Patent Number: 5,754,439
[45] Date of Patent: May 19, 1998

[54] METHOD FOR REDUCING DISPLAY LOCKING IN DIGITAL OSCILLOSCOPES OR LOGIC ANALYZERS USING INTER-ACQUISITION DITHERING TECHNIQUES

[75] Inventors: Matthew S. Holcomb; Michael L. Beyers, both of Colorado Springs, Colo.

[73] Assignee: Hewlett-Packard Co., Palo Alto, Calif.

[21] Appl. No.: 578,503

[22] Filed: Dec. 26, 1995

[51] Int. Cl.$^6$ .................................................. G01R 13/00
[52] U.S. Cl. .................. 364/487; 364/485; 324/121 R
[58] Field of Search .......................... 364/487, 921.8, 364/928, 427.2, 484–485, 920, 921.91; 324/73, 121, 76.11, 487, 484, 927–928, 77, 78; 345/112, 133; 315/364, 367; 341/109, 122

[56] References Cited

U.S. PATENT DOCUMENTS

| | | | |
|---|---|---|---|
| 4,134,149 | 1/1979 | Nord | 340/711 |
| 4,555,765 | 11/1985 | Crooke et al. | 364/487 |
| 4,647,862 | 3/1987 | Blair | 364/487 |
| 4,694,244 | 9/1987 | Whiteside et al. | 324/121 |
| 4,777,616 | 10/1988 | Moore et al. | 324/73 |
| 4,928,251 | 5/1990 | Marzalek et al. | 364/484 |
| 5,162,723 | 11/1992 | Marzalek et al. | 324/77 B |
| 5,180,971 | 1/1993 | Montijo | 324/121 |
| 5,446,650 | 8/1995 | Overhage et al. | 364/487 |

*Primary Examiner*—James P. Trammell
*Assistant Examiner*—Bryan Bui
*Attorney, Agent, or Firm*—Alexander J. Neudeck

[57] ABSTRACT

In a test instrument, display locking is reduced by the addition of a non-constant time delay to each acquisition cycle. The time delay may be randomly chosen or follow a predetermined algorithm. Decreased system throughput caused by the addition of a non-constant time delay may be minimized by alternately storing acquired data in two acquisition memories. Display locking may also be reduced by rejecting selected triggers. The data acquired from these selected triggers is not processed for display. The triggers whose data is not processed for display may be randomly chosen or they may be chosen by a predetermined algorithm. Rejecting triggers and the addition of a non-constant time delay may be used in combination or individually to reduce display locking.

14 Claims, 8 Drawing Sheets

METHOD FOR REDUCING DISPLAY LOCKING IN DIGITAL OSCILLOSCOPES OR LOGIC ANALYZERS USING INTER-ACQUISITION DITHERING TECHNIQUES

BACKGROUND OF THE INVENTION

1. Field of the Invention

The present invention relates to digital oscilloscopes and logic analyzers. More particularly, the invention presents a way of reducing "display-locking" in which digital oscilloscopes or logic analyzers may display one phase of a multi-phase signal to the exclusion of other phases.

2. Statement of the Problem

A typical digital oscilloscope or logic analyzer arms its trigger then acquires sampled data until the trigger point has been found and all the samples to be displayed have been stored. This process is termed the acquire ("ACQ") cycle. After that, the instrument calculates which of the acquired points are to be displayed, and where to display them on the screen. This process is termed the "unload" cycle. Often, the time from when a trigger is found to the end of the unload cycle is reasonably constant. This occurs because the calculations required for a given trigger, and the number of points to be transferred to the screen in the unload cycle, are, for the most part, the same each time. If the next acquisition begins a fixed period of time after the previous unload cycle, the time from the previous trigger to the time when the system is armed for the next trigger will also be reasonably constant. This situation can lead to "display lock." Display lock is a situation where the instrument's display "locks" onto one particular phase of the signal, while potentially missing others.

For example, take a signal that consists of two groups of pulses spaced 75 µs apart, which re-occur every 200 µs. The first group consists of two pulses, the second group, three. Now take an instrument that completes an acquisition and re-arms its trigger about every 150 µs. The instrument will "display lock" and only show the first group of pulses. This leads the user to believe that the signal consists only of groups which have two pulses. The "display lock" occurs because once the instrument has triggered on the first set of pulses, it misses sampling the second set of pulses because it is busy during the unload cycle and the trigger is unarmed. By the time the trigger is rearmed each time, the set of three pulses has passed, and the event that is going to trigger the instrument is the next set of two pulses. Therefore, only the set of two pulses is ever displayed.

SUMMARY OF THE INVENTION

The present invention reduces display locking by the introduction of a non-constant time delay to each acquisition cycle. This time delay may be determined through random methods, or follow a predetermined algorithm. Decreased throughput of the instrument caused by introducing this time delay can be minimized by alternately storing acquired data in two acquisition memories. Display locking may also be reduced by rejecting selected triggers. The data acquired from these selected triggers is not processed for display by the instrument. The triggers whose data is not processed for display may be randomly chosen or they may be chosen by a predetermined algorithm. Rejecting triggers and the addition of a non-constant time delay may be used individually, or in combination, to reduce display locking.

DESCRIPTION OF THE PREFERRED EMBODIMENTS

The present invention will be described in terms of a number of different embodiments. The preferred embodiment reduces display locking by introducing a time delay between acquisitions and by selectively rejecting triggers when the trigger rate is higher than the acquisition rate. In the preferred embodiment, the time delay is randomly chosen each acquisition cycle and the rejected triggers are selected at random.

Figure 1:
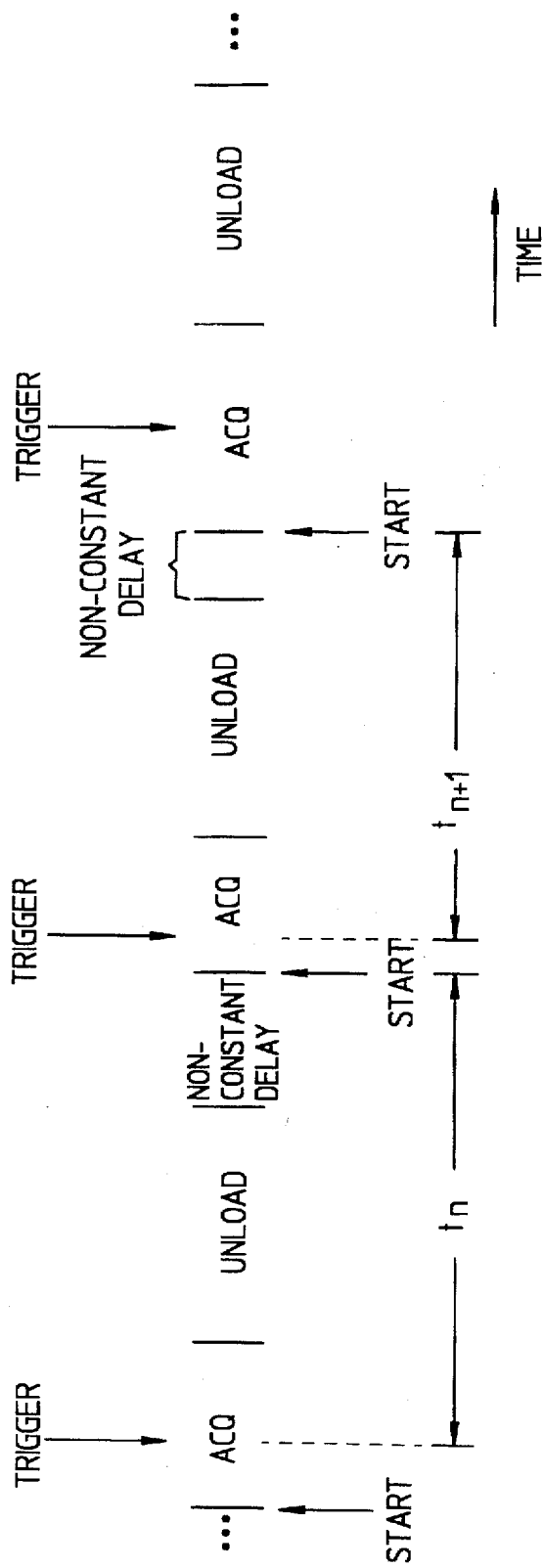
FIG. 1 is a time line which illustrates the introduction of a randomly selected time delay.

FIG. 1 shows a sequence of tasks and events versus time. At the start of each acquisition, "start," the trigger is armed and the instrument begins sampling and storing data. This is also the beginning of the ACQ cycle. Later, a trigger event occurs. The instrument keeps storing sampled data until it has gathered enough points to display through the right edge of the screen. This ends the ACQ cycle and begins the unload cycle. During the unload cycle, the instrument calculates which points are to be displayed and where on the screen they should be displayed. When this task is complete, the unload cycle ends. At this point, the instrument waits an amount of time. This time delay is limited to a maximum magnitude that is approximately the time necessary for one ACQ cycle and one unload cycle. This time delay may be chosen at random, or follow a predetermined algorithm. After the time delay, the instrument has completed one acquisition cycle. Then, the instrument starts another acquisition by rearming the trigger and sampling and storing data. An alternative embodiment may insert the time delay between the ACQ and the unload cycle, or at any time during the acquisition.

The introduction of a time delay which is selected each acquisition cycle ensures that the time between each trigger and the start of the next acquisition is never constant. This is true even if the time for the ACQ and unload cycles is constant for every acquisition. The time from one trigger to the beginning of the next acquisition cannot be constant from acquisition to acquisition since there is always non-constant element introduced by the time delay between acquisitions. This is shown in FIG. 1 by $t_n$ and $t_{n+1}$. $t_n$ and $t_{n+1}$ show the time from the trigger to the start of the next acquisition for two successive cycles. Notice that each contains a non-constant element due to the non-constant time delay between acquisitions.

Figure 2:
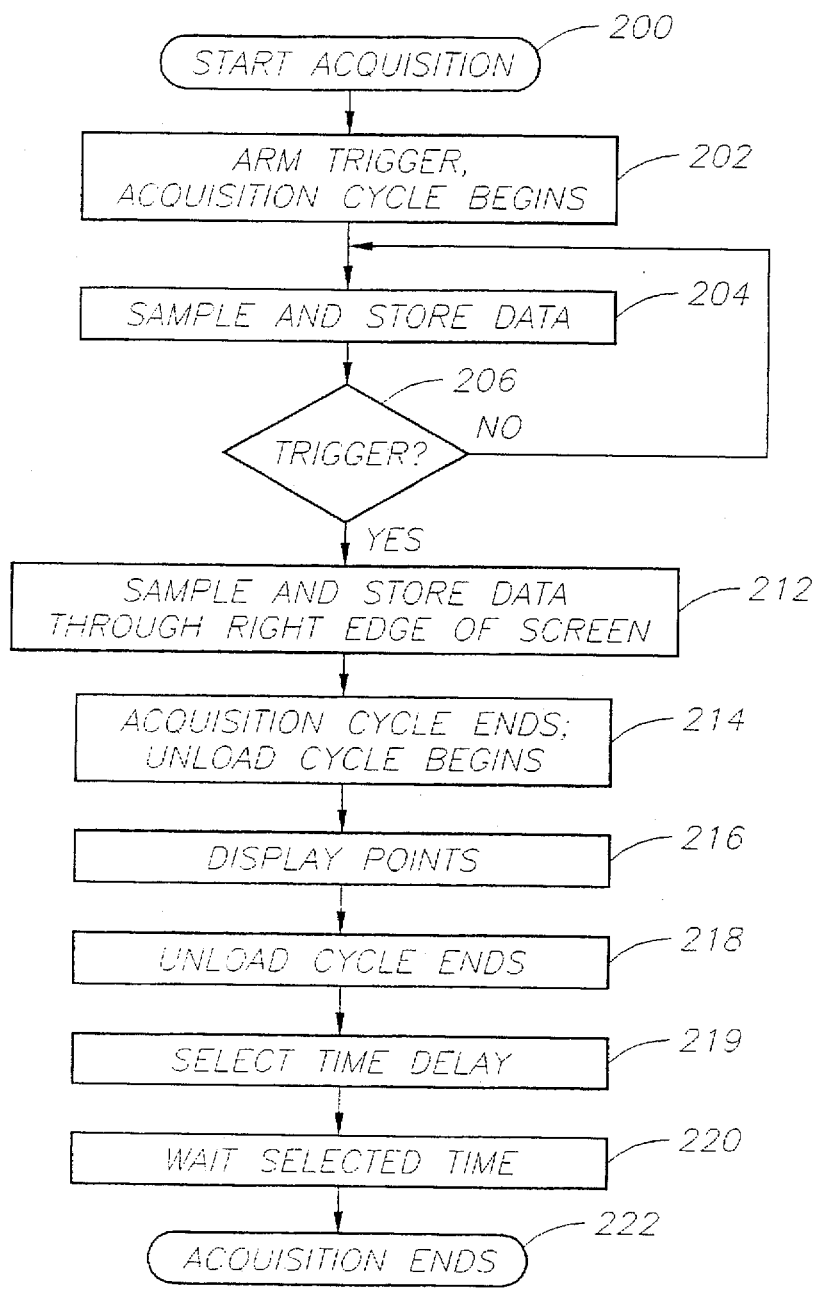
FIG. 2 is a flow chart illustrating the steps for one acquisition cycle with a time delay introduced.

FIG. 2 illustrates the steps for one acquisition which has a time delay inserted after the unload cycle. At the start of an acquisition (200) the trigger is armed, the ACQ cycle begins (202), and data starts to be sampled and stored (204). Data continues to be sampled and stored (204), until a trigger is found (206). After a trigger is found (206) data is sampled and stored until enough points have been gathered to display the waveform through the right edge of the screen (212). When this is complete, the ACQ cycle ends and the unload cycle begins (214). The instrument then displays the points it has gathered (216). When this is complete, the unload cycle ends (218). The instrument then selects an amount of time to wait (219) and waits that selected amount of time (220). The time selected to wait should be non-constant. Once that wait is over, this acquisition ends (222). At this time, a new acquisition may begin (200).

Figure 3:
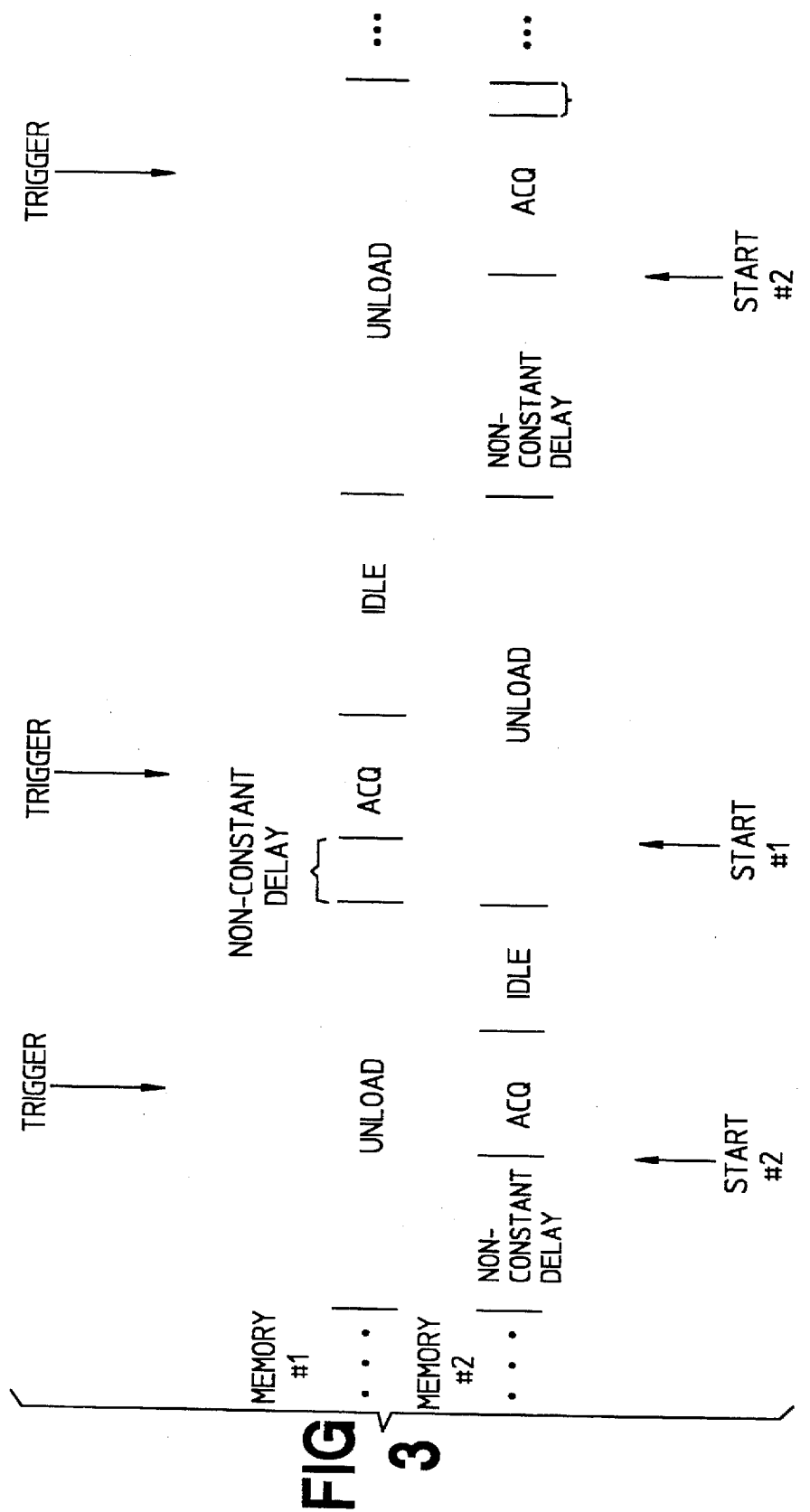
FIG. 3 is a time line which illustrates the introduction of a time delay which uses two acquisition memories to maintain system throughput.

Unfortunately, introducing a time delay decreases the instruments throughput in waveforms per second. The time delay is essentially "wasted" time that could have been used to acquire and display another waveform. FIG. 3 illustrates one way that throughput may be maintained without sacrificing performance. In FIG. 3, two memories are used to store acquired data. Acquired data from successive acquisitions is stored in alternate memories. This allows the time delay inserted into the acquisition cycle for memory #1 to occur during the unload cycle of memory #2, and visa versa. Accordingly, no time is wasted with the instrument sitting idle waiting for the time delay to expire.

Figure 8:
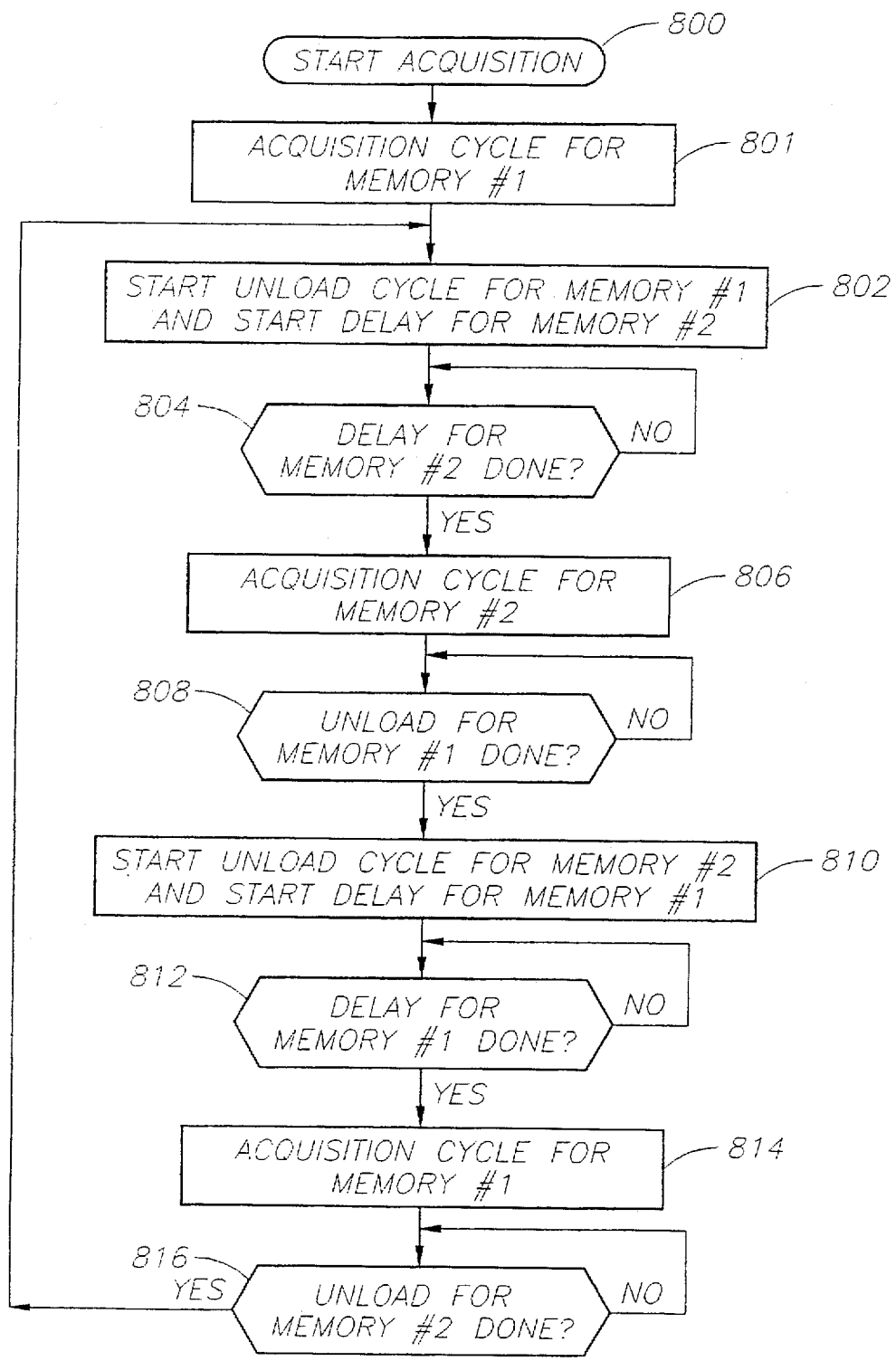
FIG. 8 is a flow chart illustrating the steps for introducing a time delay and using two acquisition memories to maintain system throughput.

FIG. 8 is a flow chart illustrating the steps for introducing a time delay that maintains system throughput by using two acquisition memories. The instrument begins with an ACQ cycle for memory #1 (800, 801). After the instrument completes the first ACQ cycle for memory #1 (801) it starts an unload cycle for memory #1 and a delay for memory #2 (802). When the delay for memory #2 is complete (804) the instrument does an ACQ cycle for memory #2 (806). After the ACQ cycle for memory #2 is complete, the instrument waits for the unload cycle for memory #1 to complete (808). Once the unload cycle for memory #1 is complete (808), an unload cycle for memory #2 and a delay for memory #1 are started (810). When the delay for memory #1 is complete (812) the instrument does an ACQ cycle for memory #1 (814). After the ACQ cycle for memory #1 is complete, the instrument waits for the unload cycle for memory #2 to complete (816). After the unload cycle for memory #2 is complete, the instrument repeats itself by starting an unload of memory #1 and a delay for memory #2 (802). The delays for memory #1 and #2 should be kept less than the unload time minus the ACQ time to maximize throughput. When the ACQ time is greater than the unload time, rejection of triggers may be used.

Figure 4:
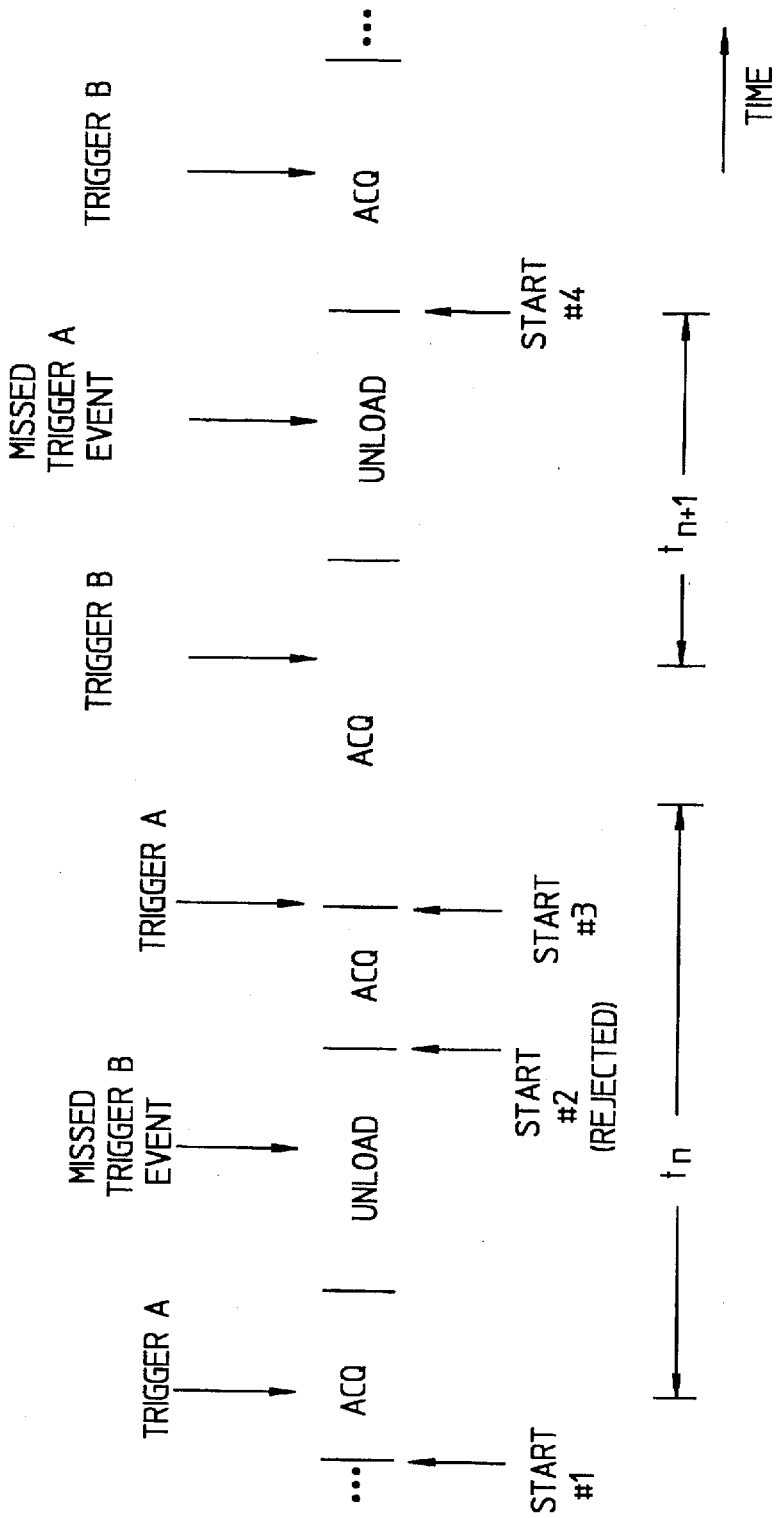
FIG. 4 is a time line which illustrates the rejection of triggers.

FIG. 4 illustrates the rejection of triggers. Assume, for example, that there are two types of trigger events, trigger A and trigger B. Assume also that these are each caused by a different part of the waveform, such as the two pulse and three pulse groups discussed earlier. During the first acquisition which starts at "start #1," the portion of the waveform associated with trigger A is captured and displayed. During the first unload cycle, however, a trigger B event occurs but that portion of the waveform is not captured because the instrument is busy with an unload cycle and the trigger is disarmed. After the first unload cycle is complete, a second acquisition is started at "start #2." Since the next trigger to occur is a trigger A, this acquisition would also capture the part of the waveform associated with trigger A, and, if left alone, miss the trigger B event during the second unload cycle. This process could repeat itself forever such that the trigger B part of the waveform would never be displayed. A classic "display lock" situation.

The second trigger, however, is rejected. It's data is never processed through the unload cycle. Instead, another acquisition is started at "start #3." This acquisition will then sample, trigger, unload, and display the part of the waveform associated with trigger B. This effectively "unlocks" the acquisition from the trigger A part of the waveform. If a sufficient number of triggers are rejected per second, many different phases of the waveform will be displayed at any one time. Trigger rejection may be enabled when the instrument detects that triggers are occurring more often than acquisitions and disabled otherwise. If triggers are occurring at a lower rate than acquisitions, the instrument is able to process all the trigger events and no phase of the waveform will fail to be displayed. The triggers to be rejected may be chosen at random or by some other means.

Figure 5:
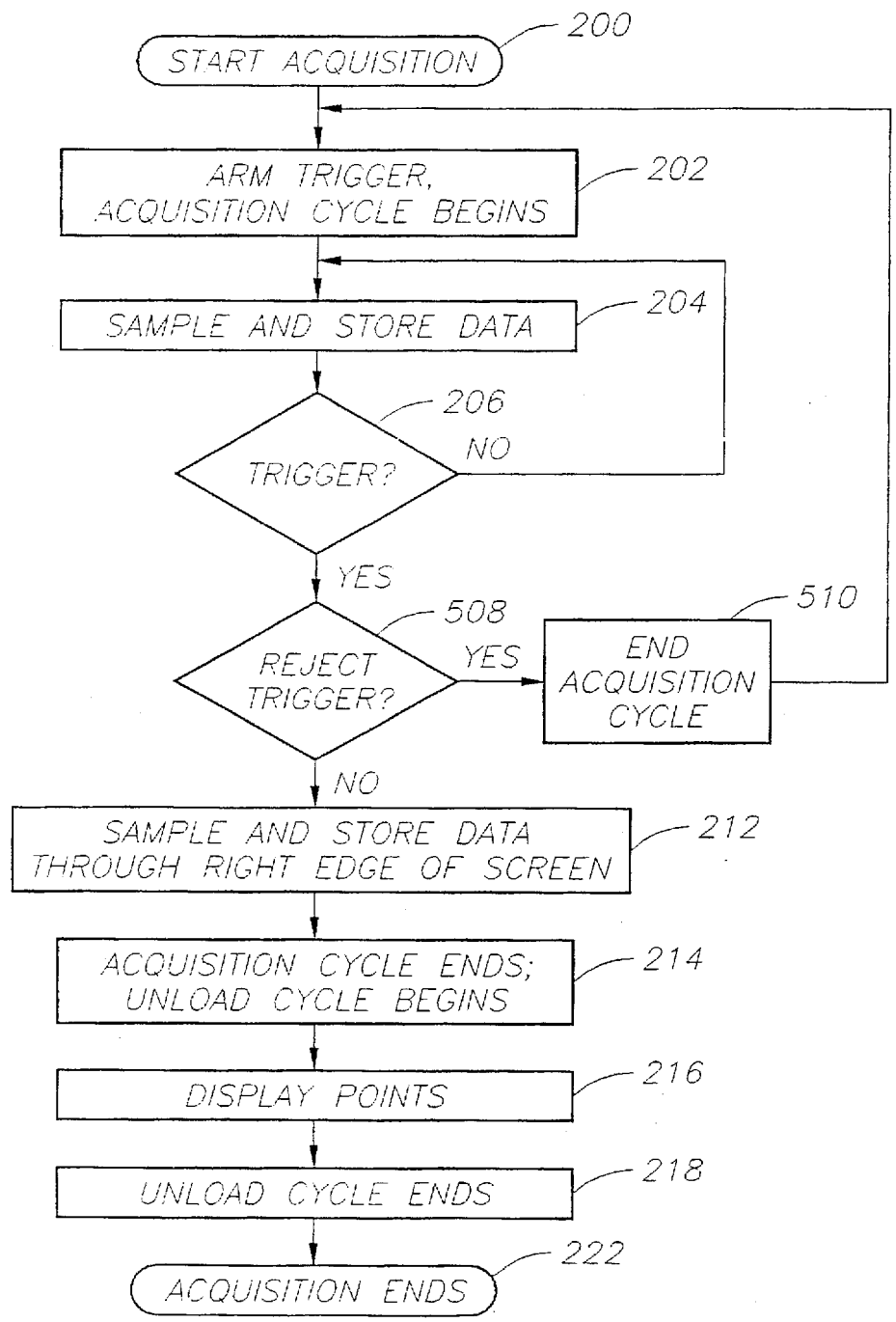
FIG. 5 is a flow chart illustrating the steps for one acquisition cycle with the rejection of triggers.

FIG. 5 illustrates the steps for an acquisition cycle which may reject triggers. Like FIG. 2, in FIG. 5 an acquisition is started and data sampled until a trigger occurs (200, 202, 204, 206). After a trigger is found (206), the instrument may choose to reject that trigger (508). If a trigger is rejected (508), the ACQ cycle ends (510), the trigger is re-armed and a new ACQ cycle is begun (202). If the trigger is not rejected, data is sampled through the right edge of the screen (212) and displayed (214, 216, 218). After the data has been displayed, the acquisition is complete (222) and a new acquisition may be started (200).

Figure 6:
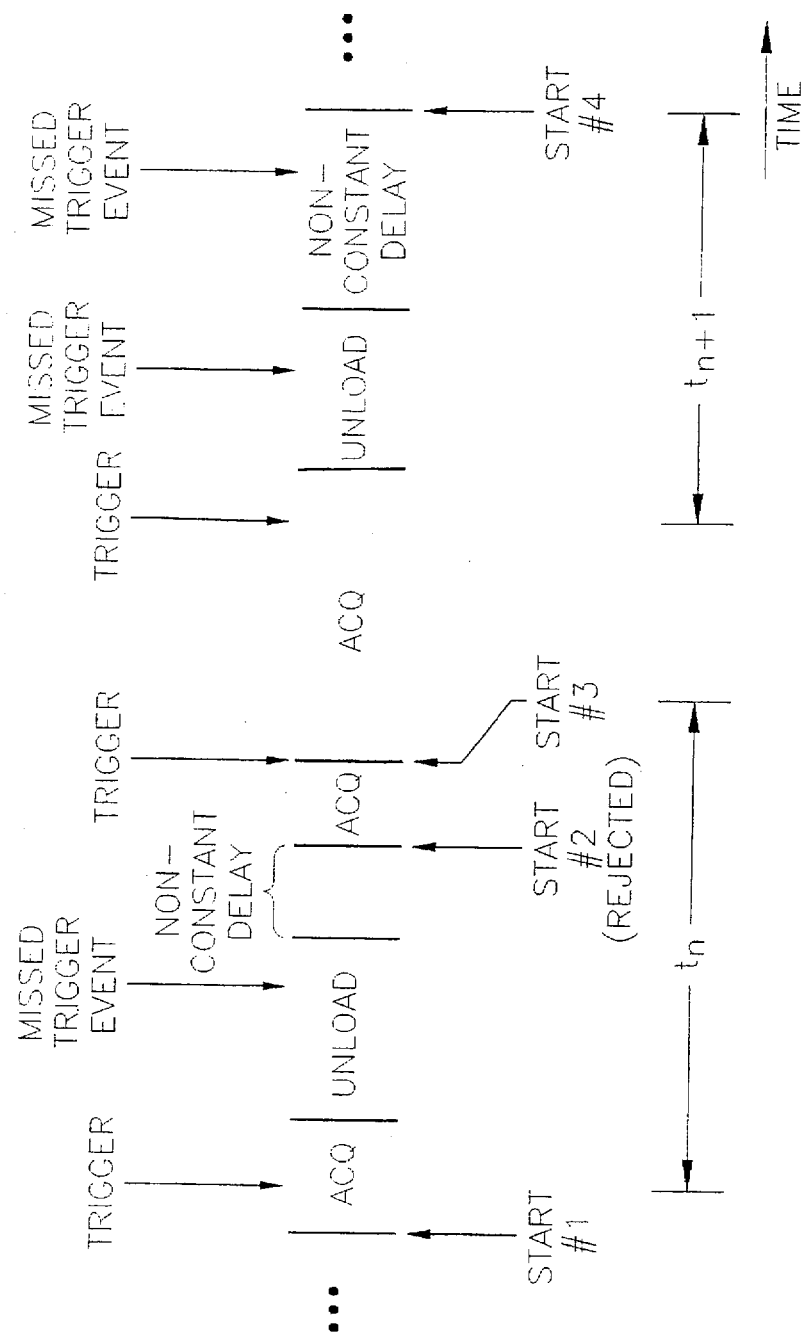
FIG. 6 is a time line which illustrates the combination of introducing a time delay and the rejection of triggers.

FIG. 6 illustrates how introduction of a time delay and trigger rejection may be combined to reduce display locking. Integrating both of these techniques ensures that the time from one trigger to the beginning of the next acquisition is not constant and forces the instrument to display the samples from many different phases of the input waveform.

Figure 7:
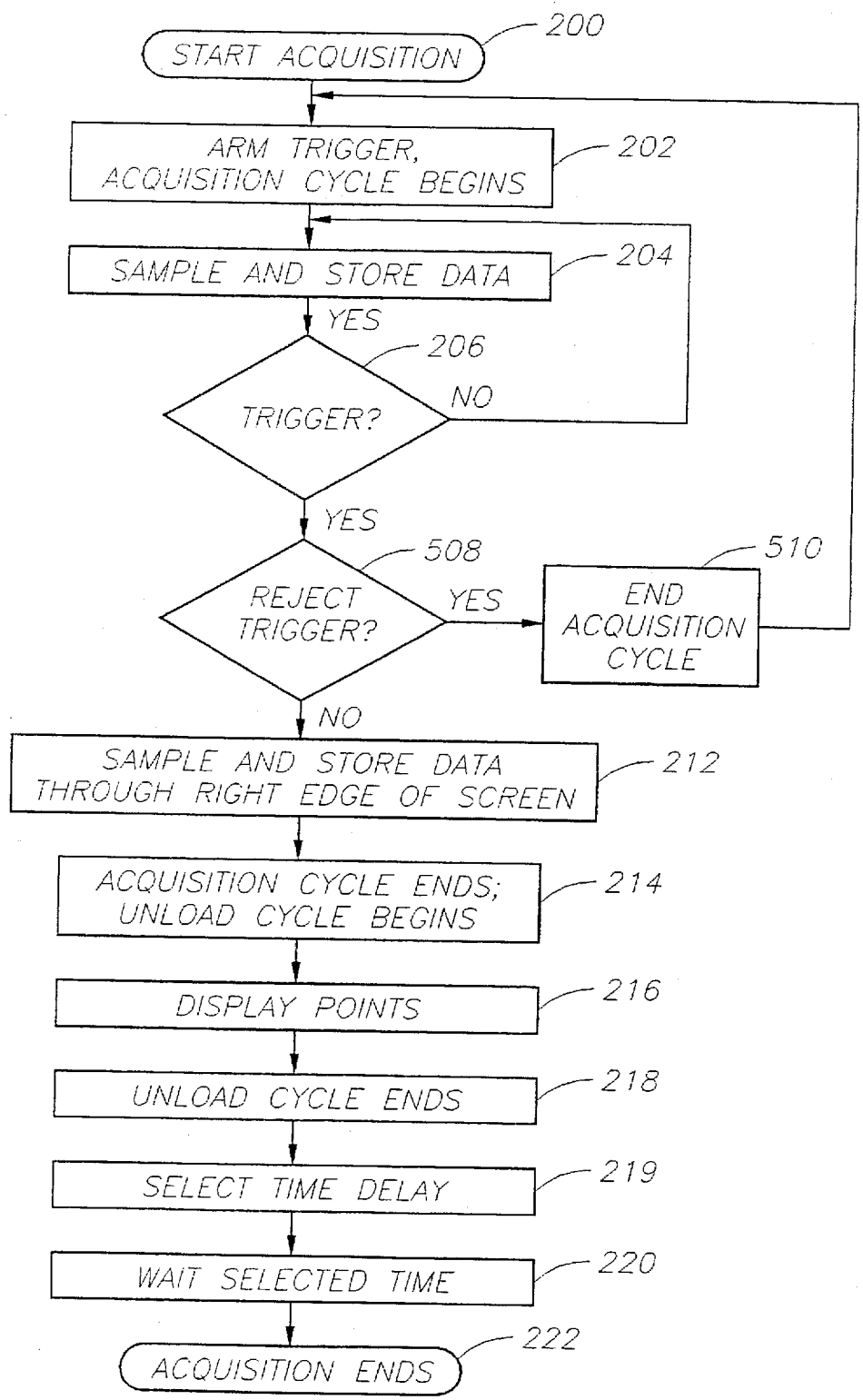
FIG. 7 is a flow chart illustrating the steps for one acquisition cycle with the combination of introducing a time delay and the rejection of triggers.

FIG. 7 illustrates the steps for an acquisition which combines trigger rejection and a time delay to reduce display locking. Like FIG. 5, in FIG. 7 an acquisition is started (200). The trigger is armed and ACQ cycle begun (202). The data is sampled and stored (204) until a trigger occurs (206). When a trigger occurs, that trigger may be rejected (508), and a new ACQ cycle begun (510, 202). If the trigger is not rejected (508), the data through the right edge of the screen is sampled and displayed (212, 214, 216, 218). Then the instrument selects an amount of time to wait (219) and waits that amount of time (220). After the delay (220), the acquisition is complete (222).

It is to be understood that the claimed invention is not to be limited by the preferred embodiments, but encompasses other modifications and alterations within the scope and spirit of the inventive concept. For example, the time delay is shown and described as occurring after the unload cycle. One alternative would be to insert the time delay after the ACQ cycle. Another example involves using a "smart" algorithm to pick triggers to be rejected instead of randomly selecting triggers. Such a "smart" algorithm may base its decision on heuristics such as the average value of the acquired points, or the number of trigger events that occur during the ACQ and unload cycle.

We claim:

1. A method for reducing display locking in an instrument having acquisition cycles, comprising:

waiting a non-incremental time delay during said acquisition cycles thereby reducing display locking, wherein said non-incremental time delay is selected by the instrument each acquisition cycle and wherein said non-incremental time delay is limited to a maximum magnitude that is equal to the time required to perform one acquisition cycle without said time delay.

2. The method of claim 1, wherein said acquisition cycles have an unload cycle, and said time delay occurs after said unload cycle.

3. The method of claim 1, wherein said instrument is a digital oscilloscope.

4. The method of claim 1, wherein said instrument is a logic analyzer.

5. A method for reducing display locking in an instrument having two acquisition memories and an input, comprising:

(a) storing a first series of acquired data in a first acquisition memory wherein said first series of acquired data is sampled from said input;

(b) waiting for a first trigger event;

(c) processing said first series of acquired data for display;

(d) selecting a first period of time to wait, wherein said first period of time to wait will occur after processing of said first series of acquired data begins;

(e) waiting said first period of time after processing of said first series of acquired data begins;

(f) storing a second series of acquired data in a second acquisition memory wherein said second series of acquired data is sampled from said input;

(g) waiting for a second trigger event;

(h) processing said second series of acquired data for display;

(i) selecting a second period of time to wait wherein said second period of time to wait will occur after processing of said second series of acquired data begins;

(j) waiting said second period of time after processing of said second series of acquired data begins; and (k) repeating steps (a) through (j).

6. The method of claim 5, wherein said first and second periods of time to wait are randomly chosen.

7. The method of claim 6, wherein said instrument is a digital oscilloscope.

8. The method of claim 6, wherein said instrument is a logic analyzer.

9. A method of reducing display locking in an instrument having acquired data to be processed for display, comprising:

selecting triggers for rejection that would otherwise have acquired data associated with said triggers processed for display, and rejecting said triggers and not processing for display acquired data associated with said triggers.

10. The method of claim 9, wherein said triggers are randomly selected for rejection.

11. A method of reducing display locking in an instrument having acquired data to be processed for display and acquisition cycles, comprising:

selecting triggers for rejection that would otherwise have acquired data associated with said triggers processed for display;

rejecting said triggers and not processing for display acquired data associated with said triggers; and adding a time delay to said acquisition cycles.

12. The method of claim 11, wherein said triggers are randomly selected for rejection and said time delay is chosen at random.

13. The method of claim 12, wherein said instrument is a digital oscilloscope.

14. The method of claim 13, wherein said instrument is a logic analyzer.

* * * * *